US009245631B2

(12) United States Patent
D'Abreu et al.

(10) Patent No.: US 9,245,631 B2
(45) Date of Patent: *Jan. 26, 2016

(54) APPARATUS AND METHOD OF STORING DATA AT A MULTI-BIT STORAGE ELEMENT

(71) Applicant: SANDISK TECHNOLOGIES INC., Plano, TX (US)

(72) Inventors: Manuel Antonio D'Abreu, El Dorado Hills, CA (US); Dimitris Pantelakis, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/288,584

(22) Filed: May 28, 2014

(65) Prior Publication Data
US 2015/0078079 A1    Mar. 19, 2015

Related U.S. Application Data

(63) Continuation of application No. 14/028,885, filed on Sep. 17, 2013.

(51) Int. Cl.
G11C 11/34   (2006.01)
G11C 16/04   (2006.01)
G11C 16/10   (2006.01)
G11C 16/08   (2006.01)
(Continued)

(52) U.S. Cl.
CPC ............ G11C 16/10 (2013.01); G11C 11/5628 (2013.01); G11C 16/0483 (2013.01); G11C 16/08 (2013.01); G11C 16/349 (2013.01)

(58) Field of Classification Search
CPC ........... G11C 11/5628; G11C 16/0483; G11C 16/10; G11C 16/08; G11C 16/349
USPC .......................... 365/185.02, 185.03, 185.33
See application file for complete search history.

(56) References Cited

U.S. PATENT DOCUMENTS 5,930,167 A    7/1999   Lee et al.
7,308,525 B2   12/2007  Lasser et al.
7,366,013 B2 *  4/2008  Roohparvar ............. 365/185.03
(Continued)

OTHER PUBLICATIONS

D'Abreu, Manuel Antonio et al. "Apparatus and Method of Using Dummy Data While Storing Data At a Multi-Bit Storage Element," U.S. Appl. No. 14/028,846, filed Sep. 17, 2013, 46 pages.
(Continued)

Primary Examiner — Vanthu Nguyen
(74) Attorney, Agent, or Firm — Toler Law Group, PC

(57) ABSTRACT

A storage device includes a controller and a non-volatile memory that includes a three-dimensional (3D) memory. A method performed in the data storage device includes receiving, at the controller, first data to be stored at the non-volatile memory. The method further includes sending, from the controller, the first data, first dummy data, and second dummy data to the non-volatile memory to be stored at respective logical pages of a single physical page in the non-volatile memory. The single physical page includes multiple storage elements that are programmable into multiple voltage states according to a mapping of bits to states. The first dummy data and the second dummy data prevent a storage element of the single physical page from being programmed to a particular voltage state of the multiple voltage states.

20 Claims, 8 Drawing Sheets

(51) Int. Cl.
*G11C 11/56* (2006.01)
*G11C 16/34* (2006.01)

(56) References Cited

U.S. PATENT DOCUMENTS

| | | | |
|---|---|---|---|
| 7,545,673 B2* | 6/2009 | Lasser | 365/185.03 |
| 7,941,592 B2* | 5/2011 | Bonella et al. | 711/103 |
| 8,595,591 B1* | 11/2013 | Shalvi et al. | 714/763 |
| 8,711,618 B2* | 4/2014 | Choi et al. | 365/185.03 |
| 8,897,066 B2* | 11/2014 | Jung | G11C 11/5628 365/185.02 |
| 8,976,583 B2* | 3/2015 | Kim | G11C 16/06 365/185.03 |
| 2009/0080247 A1 | 3/2009 | Lasser | |
| 2010/0042772 A1 | 2/2010 | Bonella et al. | |
| 2011/0302354 A1 | 12/2011 | Miller | |
| 2012/0020156 A1* | 1/2012 | Choi et al. | 365/185.03 |
| 2012/0047321 A1 | 2/2012 | Yoon et al. | |
| 2012/0063231 A1 | 3/2012 | Wood et al. | |
| 2012/0083077 A1 | 4/2012 | Yang et al. | |
| 2012/0173827 A1 | 7/2012 | Wood et al. | |
| 2013/0339603 A1 | 12/2013 | ZHU et al. | |
| 2014/0047163 A1 | 2/2014 | Kwak | |
| 2014/0063936 A1 | 3/2014 | Shim et al. | |

OTHER PUBLICATIONS

D'Abreu, Manuel Antonio et al. "Apparatus and Method of Using Dummy Data While Storing Data at a Multi-Bit Storage Element," U.S. Appl. No. 14/288,552, filed May 28, 2014, 47 pages.

Non-Final Office Action mailed Jul. 10, 2014 in U.S. Appl. No. 14/288,552, 7 pages.

Non-Final Office Action mailed Jul. 18, 2014 in U.S. Appl. No. 14/028,885, 9 pages.

International Search Report and Written Opinion of the International Searching Authority (EPO) for International Application No. PCT/US2014/054098, mailed Nov. 26, 2014, 14 pages.

Restriction Requirement mailed Jan. 9, 2015 in U.S. Appl. No. 14/028,885, 4 pages.

Final Office Action mailed Nov. 28, 2014 in U.S. Appl. No. 14/288,552, 5 pages.

Final Office Action mailed Apr. 30, 2015 in U.S. Appl. No. 14/028,885, 11 pages.

Non-Final Office Action mailed Aug. 19, 2015 in U.S. Appl. No. 14/028,846, 12 pages.

Notice of Allowance and Fee(s) Due mailed Apr. 13, 2015, U.S. Appl. No. 14/288,552, 6 pages.

* cited by examiner

APPARATUS AND METHOD OF STORING DATA AT A MULTI-BIT STORAGE ELEMENT

REFERENCE TO EARLIER-FILED APPLICATIONS

This application is a continuation of and claims priority to U.S. Non-Provisional patent application Ser. No. 14/028,885, filed Sep. 17, 2013, the contents of which are incorporated by reference herein in their entirety.

FIELD OF THE DISCLOSURE

The present disclosure is generally related to storing data at a multi-bit storage element.

BACKGROUND

Non-volatile data storage devices, such as universal serial bus (USB) flash memory devices, embedded flash memory devices, or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per storage element, 3 bits per storage element, 4 bits per storage element, or more. Although increasing the number of bits per storage element and reducing device feature dimensions may increase a storage density of a memory device, a bit error rate of data stored at the memory device may also increase. For example, errors may be caused by cross-coupling effects between adjacent memory storage elements.

Further, some flash memory devices may reserve a portion of a memory for use as Single-Level Cell (SLC) storage elements, such as in a binary cache, while a remaining portion of the memory is used as MLC storage elements. In the memory devices having a binary cache, memory storage elements in the binary cache are cycled through more often than the remaining memory storage elements and wear out faster than the other memory storage elements, shortening the useful life of the flash memory device.

SUMMARY

Accelerated wear of storage elements used as SLC storage elements and errors based on high state capacitance between adjacent memory storage elements may be reduced by selectively controlling an effective number of bits to be stored at one or more multi-bit storage elements of a memory. For example, a controller may select a particular multi-bit storage element to be used as a single bit storage element during a first time period and may select the particular multi-bit storage element to be used as a multi-bit storage element during a second time period. By selectively controlling the particular multi-bit storage element to function as both a single bit storage element during the first time period and a multi-bit storage element during the second time period, wear of the particular multi-bit storage element may be reduced as compared to a dedicated SLC storage element in a binary cache.

Additionally, when the number of bits stored at the particular multi-bit storage element is less than a total number of bits that can be stored at the particular multi-bit storage element, the controller may generate dummy data to be stored at the particular multi-bit storage element. The dummy data may prevent the particular multi-bit storage element from being programmed to a particular voltage state of multiple voltage states. For example, the dummy data may prevent the particular multi-bit storage element form being programmed to a highest voltage state of the multiple voltage states. By preventing the programming to the highest voltage state, wear of the particular multi-bit storage element may be reduced and cross-coupling effects between adjacent multi-bit storage elements may also be reduced, reducing an occurrence of errors.

DETAILED DESCRIPTION

Figure 1:
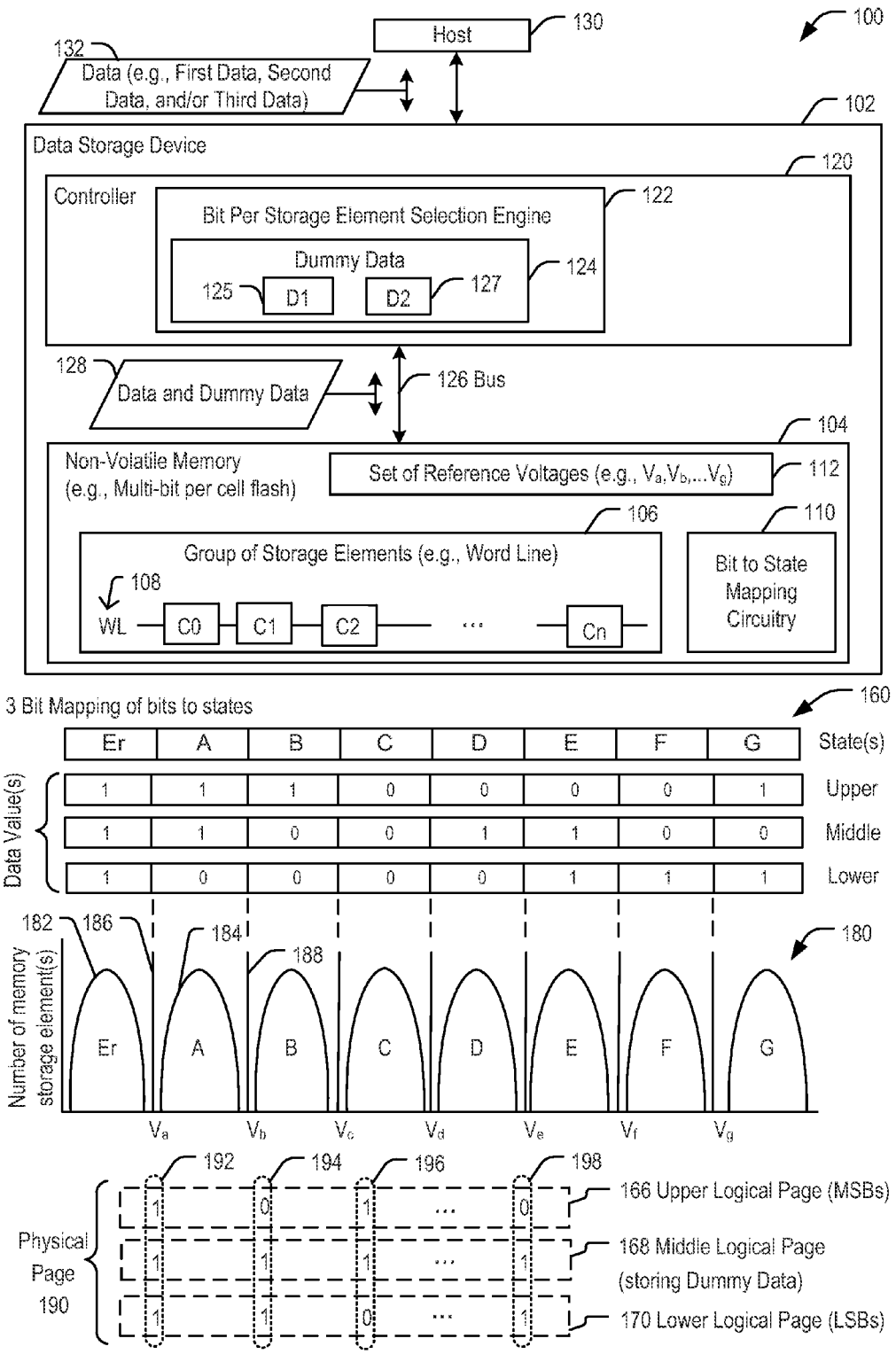
FIG. 1 is a block diagram of a particular illustrative embodiment of a system including a data storage device including a controller configured to select a number of bits to be stored at a multi-bit storage element of a memory.

Referring to FIG. 1, a system 100 includes a data storage device 102 coupled to a host device 130. The data storage device 102 includes a controller 120 and a non-volatile memory 104, such as Multi-Level Cell (MLC) flash memory, that is configured to store multiple bits per storage element. The non-volatile memory 104 may support multi-bit per storage element configurations, such as a 2 bits per storage element configuration, a 3 bits per storage element configuration, a 4 bits per storage element configuration, or other configurations of more than 4 bits per storage element. The data storage device 102 is configured to select an "effective" number of bits to be stored at one or more multi-bit storage elements of the non-volatile memory 104, such as a number of bits of user data that are stored per storage element. The data storage device 102 is further configured to selectively provide dummy data to the non-volatile memory 104 based on the selected effective number of bits to be stored at the one or more multi-bit storage elements. The dummy data provided to the one or more multi-bit storage elements may prevent the one or more multi-bit storage elements from being programmed to a particular voltage state of multiple voltage states.

The host device 130 may be configured to provide data 132, such as user data, to be stored at the non-volatile memory 104, or to request data to be read from the non-volatile memory 104. For example, the data 132 may include first data, second data, and/or third data. The host device 130 may include a mobile telephone, a music player, a video player, a gaming console, an electronic book reader, a personal digital assistant (PDA), a computer, such as a laptop computer, a notebook computer, or a tablet computer, any other electronic device, or any combination thereof.

The host device 130 may be configured to implement a communication protocol via a memory interface that enables reading from the non-volatile memory 104 and writing to the non-volatile memory 104. For example, the host device 130 may operate in compliance with a Joint Electron Devices Engineering Council (JEDEC) industry specification. As other examples, the host device 130 may operate in compliance with one or more other specifications.

The data storage device 102 may be configured to be coupled to the host device 130. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 may be configured to receive the data 132 from the host device 130, via the controller 120, for storage in the non-volatile memory 104. For example, the controller 120 is configured to receive data and instructions from the host device 130. The controller 120 is further configured to send data and commands to the non-volatile memory 104 and to receive data from the non-volatile memory 104 via a bus 126. For example, the controller 120 may be configured to send data and a write command to instruct the non-volatile memory 104 to store the data 132 to a specified address of the non-volatile memory 104, such as an address corresponding to a multi-bit storage element of the non-volatile memory 104. As another example, the controller 120 may be configured to send a read command to read data from a specified address of the non-volatile memory 104.

The controller 120 may include a bit per storage element selection engine 122. The bit per storage element selection engine 122 may select a corresponding number of bits to be stored at one or more storage elements of the non-volatile memory 104. The number of bits to be stored may be less than or equal to the total number of bits. To illustrate, the bit per storage element selection engine 122 may select a number of bits to be stored at a 3 bit storage element. For example, the bit per storage element selection engine 122 may designate that the 3 bit storage element is to be used as a 1 bit storage element, a 2 bit storage element, or a 3 bit storage element. In another implementation, the bit per storage element selection engine 122 may select a number of bits to be stored at a 4 bit storage element. For example, the bit per storage element selection engine 122 may designate that the 4 bit storage element is to be used as a 1 bit storage element, a 2 bit storage element, a 3 bit storage element, or a 4 bit storage element. Thus, the bit per storage element selection engine 122 may select a number of bits to be stored at a particular storage element, such as a multi-bit storage element, that is able to store a total number of bits.

To use the particular storage element at a reduced capacity, the particular storage element may still be programmed based on the total number of bits that the particular storage element can store. When the particular storage element is used at the reduced capacity, at least one logical page of the particular storage element stores dummy data 124 while the other logical pages store user data, such as the data 132. The dummy data 124 may include first dummy data 125, second dummy data 127, or a combination thereof. Accordingly, the controller 120 may send the total number of bits able to be stored at the particular storage element even when the particular storage element is used at the reduced capacity. Because the non-volatile memory 104 receives the total number of bits even when the number of bits to be stored at the particular storage element is less than the total number of bits, the non-volatile memory 104 may program the particular storage element to store data at the reduced capacity without any additional hardware as compared to when the particular storage element stores the total number of bits.

The bit per storage element storage engine 122 may select which bit(s) of the total number of bits of the particular storage element are to store the data 132. The bit per storage element storage engine 122 may generate dummy data 124, such as first dummy data 125 and/or second dummy data 127, for each bit of the particular storage element that is not selected to store the data 132. Additionally or alternatively, the bit per storage element storage engine 122 may select which bit(s) of the total number of bits of the particular storage element is to store the dummy data 124. By selecting which bit(s) of the particular storage element are to receive the data 132 or the dummy data 124, the bit per storage element storage engine 122 may prevent the particular storage element from being programmed to a particular voltage state, such as a highest voltage state, as described further herein. The controller 120 may then send data 128, including the data 132 or a combination of the data 132 and the dummy data 124 (e.g., the first dummy data 125 and/or the second dummy data 127), to the non-volatile memory 104 for storage.

The non-volatile memory 104 may include a NAND flash memory, a NOR flash memory, or any other type of flash memory. The non-volatile memory 104 may include a Multi-Level Cell (MLC) flash memory configured to store a plurality of bits per storage element. For example, the non-volatile memory 104 may include a tri-level cell (TLC) flash memory that is configured to store 3 bits in each memory storage element of the non-volatile memory 104.

The non-volatile memory 104 includes bit to state mapping circuitry 110, a set of reference voltages 112, and a representative group of storage elements 106. The representative group of storage elements 106 may include one or more representative storage elements C0-Cn. The group of storage elements 106 may be included in a word line (WL) 108. For example, the group of storage elements 106 may include a first storage element C0, a second storage element C1, a third storage element C2, and a fourth storage element Cn. Although the word line 108 is depicted as including four storage elements, the word line 108 may include any number of storage elements.

Each storage element of the group 106 may be a multi-level cell (MLC) flash memory cell that is able to store multiple bits. For example, each storage element C0-Cn may be programmed with a voltage value corresponding to a voltage state of the storage element, such as a predefined voltage state corresponding to a particular range of threshold voltage values. The voltage state of each storage element may correspond to a data value stored at the storage element, as described further herein.

The word line 108 may include one or more physical pages. Each physical page of the word line 108 may include one or more storage elements. The non-volatile memory 104 may also include multiple blocks of storage elements, such as erase blocks of a flash memory that includes multiple word lines in each erase block, as described further with reference to FIG. 2.

The set of reference voltages 112 may define voltages associated with the storage elements C0-Cn. The set of reference voltages 112 may divide an available range of threshold voltages of each storage element C0-Cn into multiple voltage states that each correspond to a data value to be stored at a particular storage element. A number of reference voltages included in the set of reference voltages 112 may classify a total number of bits per storage element that may be stored at each of the storage elements C0-Cn. For example, when the set of reference voltages 112 includes three reference voltages, each of the storage elements C0-Cn may have four available (or possible) voltage states. The four voltage states may correspond to four data values that are based on 2 bits per storage element, such as a first bit value of "0 0", a second bit value of "0 1", a third bit value of "1 0", and a fourth bit value of "1 1". As another example, when the set of reference voltages 112 includes seven reference voltages, the storage elements may each have eight available voltage states that correspond to eight data values generated based on 3 bits per storage element. As a further example, when the set of reference voltages 112 includes fifteen reference voltages, the storage elements may each have sixteen available voltage states that correspond to sixteen data values generated based on 4 bits per storage element.

The non-volatile memory 104 may include one or more additional sets of reference voltages. For example, in a three bit per storage element implementation, the set of reference voltages 112 may include a first particular set of seven reference voltages for use with a block of the non-volatile memory 104 and another set of seven reference voltages for use with another block of the non-volatile memory 104 (e.g., to accommodate effects of uneven wear among the block of the non-volatile memory 104).

The non-volatile memory 104 may include read circuitry and write circuitry (e.g., read/write circuitry) for reading and writing data to the storage elements C0-Cn. The read/write circuitry may include the bit to state mapping circuitry 110, the set of reference voltages 112, or a combination thereof. The write circuitry included in the non-volatile memory 104 may be configured to write a data value (e.g., a set of bits) to a particular storage element of the storage elements C0-Cn by programming a voltage value corresponding to a particular voltage state to the particular storage element. The voltage value may be selected based on the data value by the bit to state mapping circuitry 110. For example, the bit to state mapping circuitry 110 may determine the particular voltage state corresponding to a particular bit value received from the controller 120. The write circuitry may program the particular storage element to a voltage value that corresponds to the particular voltage state.

The read circuitry may be configured to determine a data value stored at the particular storage element based on the particular voltage state read from the particular storage element. Based on the voltage state of the particular storage element, the bit to state mapping circuitry 110 may determine the data value stored at the particular storage element using the mapping of bits to states.

An illustrative example of a 3 bit mapping of bits to states 160 applied by the bit state mapping circuitry 110 may be stored at or accessible to the bit to state mapping circuitry 110. Based on the 3 bit mapping of bits to states 160, a storage element may be programmed into one of eight possible voltage states, designated as "Er" (erase), "A", "B", "C", "D", "E", "F", and "G". Each of the predefined voltage states may be mapped to a corresponding 3 bit data value associated with a first bit located in an "upper" page, a second bit located in a "middle" page, and a third bit located in a "lower" page. For example, the first bit may be associated with a most significant bit (MSB) of the 3 bit data value and the third bit may be associated with a least significant bit (LSB) of the 3 bit data value.

A graph 180 illustrates voltage states (e.g., according to the 3 bit mapping of bits to states 160) in a histogram showing a number of storage elements for each threshold voltage value. For example, the voltage states "Er", "A", "B", "C", "D", "E", "F", and "G" are depicted relative to reference voltages $V_a$, $V_b$, $V_c$, $V_d$, $V_e$, $V_f$, $V_g$ that may be included in the set of reference voltages 112. Accordingly, each of the voltage states "Er", "A", "B", "C", "D", "E", "F", and "G" has a corresponding voltage value range based on one or more of the reference voltages $V_a$, $V_b$, $V_c$, $V_d$, $V_e$, $V_f$, $V_g$. For example, the voltage state "Er" 182 has a voltage value (corresponding to an all ones data value of "1 1 1") that is less than a reference voltage $V_a$ 186. As another example, the voltage state "A" 184 has a voltage value (corresponding to a data value of "1 1 0") that is greater than or equal to a reference voltage $V_a$ 186 and less than a reference voltage $V_b$ 188.

An example of a physical page 190 associated with the word line 108 is depicted as storing a first data value 192, a second data value 194, a third data value 196, and an fourth data value 198. Each of the one or more data values 192-198 may correspond to a storage element of the group 106 including the storage elements C0-Cn of the word line 108. For example, the first data value 192 may correspond to the first storage element C0, the second data value may correspond to the second storage element C1, the third data value 196 may correspond to the third storage element C2, and the fourth data value 198 may correspond to the fourth storage element Cn. Although the physical page 190 is depicted as corresponding to four storage elements, the physical page 190 may correspond to any number of storage elements (e.g., 2,000 storage elements).

The physical page 190 may include multiple logical pages, such as an upper logical page 166, a middle logical page 168, and a lower logical page 170. Each of the logical pages 166-170 may store a bit value for each of the data values 192-198. For example, the upper logical page 166 may correspond to most significant bits (MSBs) of the data values 192-198 and the lower logical page may correspond to least significant bits (LSBs) of the data values 192-198. The data values 192-198 stored at the physical page 190 may each correspond to a voltage state, such as one of the voltage states "Er", "A", "B", "C", "D", "E", "F", and "G" of the 3 bit mapping of bits to states 160. To illustrate, the first data value 192 may store an all-ones value "1 1 1" corresponding to voltage state "Er" and the second data value 194 may store a value "0 1 1" corresponding to voltage state "E".

In a particular embodiment, the physical page 190 may store dummy data, such as the dummy data 124, in the upper logical page 166, the middle logical page 168, the lower logical page 170, or a combination thereof, based on a number of bits to be stored as selected by the bit per storage element selection engine 122. For example, as illustrated in the physical page 190, the middle logical page 168 stores an all-ones bit sequence of the dummy data 124.

During operation, the data storage device 102 may receive the data 132 from the host device 130. For example, the controller 120 may receive the data 132, such as a sequence of bit values, to be stored at the non-volatile memory 104. The data 132 may include first data (e.g., a first page of user data), second data (e.g., a second page of user data), and third data (e.g. a third page of user data).

The controller 120 may receive the data 132 and may identify one or more storage elements to store the data 132. For the identified one or more storage elements, the bit per storage element selection engine 122 may determine an effective number of bits to be stored at each of the one or more storage elements. The one or more storage elements may be included in a single physical page. For example, the one or more storage elements may each include 3 bit storage elements and the bit per storage element selection engine 122 may determine whether to store 1 bit, 2 bits, or 3 bits at each of the one or more storage elements. The bit per storage element selection engine 122 may generate the dummy data 124 when the selected effective number of bits is less than the total number of bits that the storage element is configured to store. When a determination is made to store a reduced number of bits at each 3 bit storage element, the dummy data 124 may include the first dummy data 125, or the first dummy data 125 and the second dummy data 127 depending on the number of bits to be stored at each of the 3 bit storage elements. The controller 120 may send the data 128, including the data 132 or a combination of the data 132 and the dummy data 124, to the non-volatile memory 104 for storage at the one or more storage elements. The dummy data 124 may prevent the one or more storage elements from being programmed to a particular voltage state, such as a highest voltage state. For example, the dummy data 124 may include a bit value that prevents a particular storage element from being programmed to the particular voltage state by prohibiting a particular data value corresponding to the particular voltage state from being stored at the particular storage element. By preventing a particular voltage state, such as the highest voltage state, errors caused by a cross-coupling effect between the multi-bit storage element and storage elements adjacent to the multi-bit storage element may be reduced and an amount of errors based on high voltage state capacitance may be reduced.

The non-volatile memory 104 may receive the data 128 and provide the data 128 to the bit to state mapping circuitry 110. The bit to state mapping circuitry 110 may map the data 128 to voltage states. The non-volatile memory 104 may program each of the one or more storage elements identified by the controller 120 with the voltage states determined by the bit to state mapping circuitry 110.

In a first illustrative example, a group of 3 bit storage elements (e.g., the physical page 190) may include three logical pages, such as an upper logical page associated with a most significant bit (MSB), a middle logical page, and a lower logical page associated with a least significant bit (LSB). When the bit per storage element selection engine 122 selects the group of 3 bit storage elements to store 2 bits per storage element, the bit per storage element storage engine 122 may select the upper logical page and the lower logical page to store the data 132 (or, alternatively, may select the middle logical page to store the dummy data 124). For example, the upper logical page may store a first portion of the data 132 (e.g., first data) and the lower logical page may store a second portion of the data 132 (e.g., second data). The bit per storage element selection engine 122 may generate the dummy data 124 to be stored at the middle logical page. The dummy data 124 may include an all ones sequence or an all zeros sequence. As illustrated with respect to the physical page 190, the dummy data 124 is all ones. As a result, all of the storage elements in the physical page 190 are constrained to be in one of the voltage states "Er", "A", "D", or "E", preventing a storage element from being programmed to one or more particular voltage states, such as a highest voltage state "G" or the second highest voltage state "F". The controller 120 may then send the data 128, including the dummy data 124 and the data 132 (e.g., the first portion and the second portion), to the non-volatile memory 104 for storage at the group of 3 bit storage elements. Each of the first portion of the data 132, the second portion of the data 132, and the dummy data 124 may be stored at respective logical pages of the group of 3 bit storage elements.

In a second illustrative example, the bit per storage element selection engine 122 may select a number of bits to be stored at a group of 3 bit storage elements (e.g., the physical page 190). In response to a selection by the bit per storage element selection engine 122 to use each storage element of the group of 3 bit storage elements as a 1 bit storage element, the bit per storage element selection engine 122 may generate dummy data 124 that includes first dummy data 125 and second dummy data 127. The bit per storage element storage engine 122 may select one logical page associated with the storage element to receive the data 132 (e.g., a portion of the data 132), and the two other logical pages receive the first dummy data 125 and the second dummy data 127. For example, the upper logical page may receive the data 132, the middle logical page may receive the first dummy data 125, and the lower logical page may receive the second dummy data 127. The first dummy data 125 and the second dummy data 127 may each be an all ones bit sequence or an all zeros bit sequence. Alternatively, the first dummy data 125 may be an all ones bit sequence and the second dummy data 127 may be an all zeros bit sequence. If the first dummy data 125 and the second dummy data 127 includes all ones for the middle logical page and the lower logical page, all storage elements either remain in an "Er" voltage state (a "1" value) or are programmed to voltage state "E" (a "0" value). The separation between the voltage states "Er" and "E" may result in a lower error rate due to threshold voltage shifts of individual storage elements. Additionally, all of the storage elements in the physical page 190 are constrained to be in one of the voltage states "Er" or "E", preventing a storage element from being programmed to one or more particular voltage states, such as a highest voltage state "G" or the second highest voltage state "F".

By selecting a number of bits per storage element to be stored at a multi-bit storage element and selectively providing dummy data to the multi-bit storage element, the controller 120 may prevent the multi-bit storage element from being programmed to a particular voltage state of multiple voltage states. By preventing the multi-bit storage element from being programmed to the particular voltage state, such as the highest voltage state, errors caused by a cross-coupling effect between the multi-bit storage element and storage elements adjacent to the multi-bit storage element may be reduced and an amount of errors based on high voltage state capacitance may be reduced. Alternatively or additionally, different storage elements may be selected to store different numbers of bits. Accordingly, none of the storage elements of the memory are dedicated at all times to operate in a particular bit per storage element configuration, such a single bit per storage element configuration as part of a binary cache. Accordingly, a number of bits stored at a particular storage element may be varied to prevent the particular storage element from being used exclusively as a dedicated single bit storage element, thereby reducing wear. For example, a controller may select a particular multi-bit storage element to be used as a single bit storage element during a first time period and may select the particular multi-bit storage element to be used as a multi-bit storage element during a second time period. Alternatively or additionally, the same instructions may be used for read operations or write operations for all bit modes regardless of whether a particular bit mode uses the dummy data 124. Therefore, different instructions are not needed to operate the particular storage element as a 1 bit storage element, a 2 bit storage element, a 3 bit storage element, a 4 bit storage element, or as a storage element that stores more than 4 bits.

Figure 2:
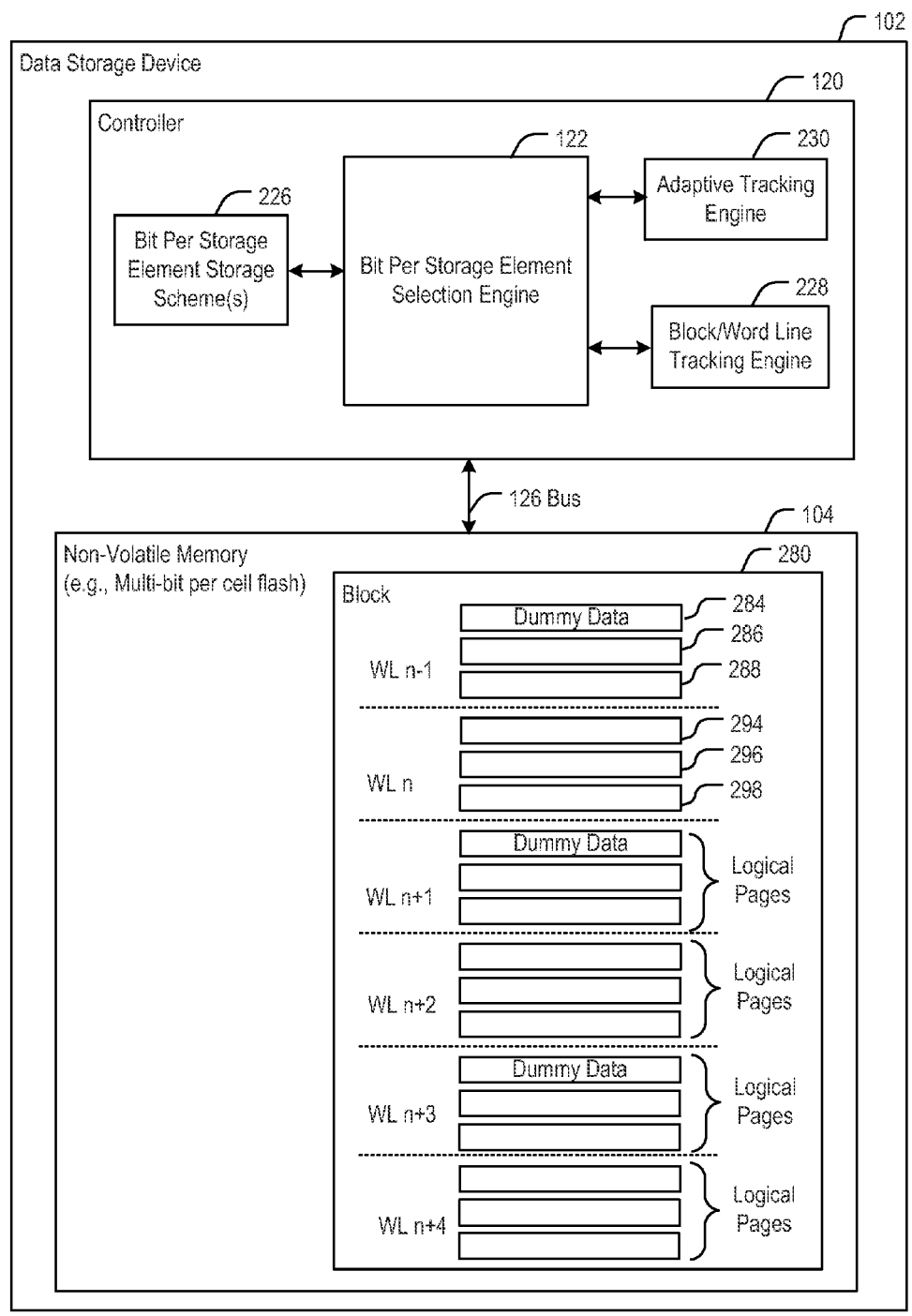
FIG. 2 is a block diagram illustrating a particular embodiment of components that may be incorporated in the data storage device of FIG. 1.

Referring to FIG. 2, a particular illustrative embodiment of the data storage device 102 of FIG. 1 showing additional detail of the non-volatile memory 104 and the controller 120 is depicted. The controller 120 may include the bit per storage element selection engine 122, a bit per storage element storage scheme(s) 226, a block/word line tracking engine 228, and an adaptive tracking engine 230.

The bit per storage element storage scheme(s) 226 may include one or more bit per storage element storage schemes. Each bit per storage element storage scheme may indicate a number of data bits, a number of dummy bits, or a combination thereof, to be stored at one or more word lines, one or more physical pages, one or more storage elements, or a combination thereof. The one or more bit per storage element storage schemes may include a block storage scheme, a word line storage scheme, or a combination thereof. The block storage scheme may identify a pattern or a scheme of bits per storage element to be applied to a plurality of word lines included in a block of the non-volatile memory 104, as described further with reference to FIG. 5. The word line storage scheme may identify a scheme of bits per storage element to be applied to a word line, to one or more physical page of a word line, or to one or more storage elements, as described with reference to FIGS. 3, 4, and 6. Additionally or alternatively, the bit per storage element storage scheme(s) 226 may include one or more mappings of bits to states (e.g., a mapping of bits to states associated with any number of bits) that may be used to translate a data value into a voltage state that programmed at a storage element and to translate a voltage state programmed at a storage element into a data value.

The bit per storage element selection engine 122 may select a particular bit per storage element storage scheme from the bit per storage element storage scheme(s) 226. For example, the bit per storage element selection engine 122 may select the particular bit per storage element storage scheme to be applied to a block, a word line, a physical page, a storage element, or a combination thereof, of the non-volatile memory 104. The bit per storage element selection engine 122 may select the particular bit per storage element storage scheme based on a predetermined selection pattern, based on a timer, based on an input received from the adaptive tracking engine 230, based on an input of the block/word line tracking engine 228, or a combination thereof. The bit per storage element selection engine 122 may provide an indication of the selected particular bit per storage element storage scheme to the block/word line tracking engine 228.

The bit per storage element selection engine 122 may select or determine a number of bits to be stored at each of one or more storage elements based on or in accordance with the selected particular bit per storage element storage scheme. For example, the bit per storage element selection engine 122 may select whether to assign to a particular storage element a single logical page of user data, two logical pages of user data, or three or more logical pages of user data in an implementation where the single physical page includes three or more logical pages. Additionally or alternatively, the bit per storage element selection engine 122 may determine a number of logical pages of a physical page to receive dummy data, such as the dummy data 124 of FIG. 1. The bit per storage element selection engine 122 may provide the block/word line tracking engine 228 with a first indication of the number of bits stored at each of the multiple storage elements, a second indication of which logical pages include data, a third indication of which logical pages include dummy data, or a combination thereof.

The block/word line tracking engine 228 is configured to track a bit per storage element storage scheme that is applied to the non-volatile memory 104, such as a bit per storage element storage scheme that is applied to a block, to a word line, to a physical page, and/or to a storage element of the non-volatile memory 104. Additionally or alternatively, the block/word line tracking engine 228 may track a location of data bits, a location of dummy bits, or a combination thereof, stored at a block, a word line, a physical page, or a storage element of the non-volatile memory 104. The block/word line tracking engine 228 may store and maintain indicators accessible to the bit per storage element selection engine 122, including indicators for a bit per storage element storage scheme, a location of data bits, a location of dummy bits, or a combination thereof, that may be read by the bit per storage element selection engine 122, one or more additional components of the data storage device, such as a read/write circuit or a processor unit, or a combination thereof.

The adaptive tracking engine 230 may track one or more parameters associated with operation of the non-volatile memory 104, such as one or more parameters associated with a block, a word line, a physical page, a storage element, or a combination thereof. The one or more parameters may include an erase time for a particular block, a number of block erases, a set number of memory operations, a frequency of one or more storage elements being erased or written to, a number of programmed storage elements in a word line, a number of errors associated with a storage element, a physical page, a word line, or a block, a density of programmed cells in a word line, or a combination thereof.

The one or more parameters may be provided as an input to the bit per storage element selection engine 122. The bit per storage element selection engine 122 may select or initiate selection of a bit per storage element storage scheme based on one or more of the one or more parameters. For example, the bit per storage element selection engine 122 may initiate a selection of a bit per storage element storage scheme applied to a block, a word line, a physical page, or a storage element of the non-volatile memory 104 in response to receiving the one or more parameters. As an illustrative example, the bit per storage element selection engine 122 may change a particular bit per storage element storage scheme for a particular block of the non-volatile memory 104 from a first bit per storage element storage scheme to a second bit per storage element storage scheme based on an indication that an erase time (e.g., a number of pulses required to return storage elements to the erase state) for the particular block is increasing or has increased above a threshold.

The non-volatile memory 104 may include a block 280 that includes a plurality of word lines. The plurality of word lines may include a first word line WLn−1, a second word line WLn, a third word line WLn+1, a fourth word line WLn+2, a fifth word line WLn+3, and a sixth word line WLn+4. For example, one of the word lines of the plurality of word lines may correspond to the word line 108 of FIG. 1. Although the block 280 is depicted as including six word lines, the block 280 may include more than six word lines (or less than six word lines).

Each word line of the plurality of word lines may be associated with multiple logical pages. For example, the first word line WLn−1 may be associated with a plurality of logical pages, such as a first logical page 284, a second logical page 286, and a third logical page 288. The plurality of logical pages associated with the first word line WLn−1 may correspond to the upper logical page 166, the middle logical page 168, and the lower logical page 170 of FIG. 1. As another example, the second word line WLn may be associated with a fourth logical page 294, a fifth logical page 296, and a sixth logical page 298. Although each of the plurality of word lines is depicted as including three logical pages, each word line may have any number of logical pages, such as two or more logical pages.

A particular bit to cell storage scheme selected by the bit per storage element selection engine 122 may correspond to a pattern applied to the plurality of word lines of the block 280. As a first illustrative example, the bit per storage element selection engine 122 may select a first bit to cell storage scheme associated with a first pattern where alternating word lines store dummy data in a single corresponding logical page. When the first bit to cell storage scheme is applied and data is stored at one or more of the word lines of the block 280, dummy data may be stored at a single logical page of the first word line WLn−1, the third word line WLn+1, and the fifth word line WLn+3, or a combination thereof. For example, the first word line WLn−1 may store dummy data in the first logical page 284, the second logical page 286, or the third logical page 288 of the first word line WLn−1.

As a second illustrative example, the bit per storage element selection engine 122 may select a second bit to cell storage scheme associated with a second pattern where alternating word lines store dummy data in two corresponding logical pages. When the second bit to cell storage scheme is applied and data is stored at one or more of the word lines of the block 280, dummy data may be stored at logical pages of the first word line WLn−1, the third word line WLn+1, and the fifth word line WLn+3, or a combination thereof. For example, the first logical page WLn−1 may store dummy data in any two logical pages of the first logical page 284, the second logical page 286, and the third logical page 288.

During operation, the bit per storage element selection engine 122 may select a particular bit per storage element storage scheme from the bit per storage element storage scheme(s) 226 to be applied to the block 280 of the non-volatile memory 104. For example, the bit per storage element selection engine 122 may select the particular bit per storage element storage scheme based on one or more parameters received from the adaptive tracking engine 230.

The controller 120 may receive user data, such as the data 132 of FIG. 1, to be stored at the non-volatile memory 104. The user data to be stored at the non-volatile memory 104 may include first data and second data. The controller 120 may determine a location, such as a particular word line or a particular physical page, of the block 280 in which the user data is to be stored. Based on the location determined by the controller 120 and the particular bit per storage element storage scheme, the bit per storage element selection engine 122 may select a number of bits to be stored at each of one or more storage elements associated with the location. For example, the bit per storage element selection engine 122 may select the one or more storage elements to each store 2 bits per storage element. The bit per storage element selection engine 122 may also determine which, if any, of the logical pages of the one or more storage elements are to receive dummy data. For example, when the one or more storage elements may each store a total of 3 bits per storage element, the bit per storage element selection engine 122 may determine that a particular logical page of the one or more storage elements are to receive dummy data, such as the dummy data 124 of FIG. 1. The bit per storage element selection engine 122 may provide an indication of the logical page to receive the dummy data to the block/word line tracking engine 228. Accordingly, the controller 120 may send the dummy data, the first data, and the second data to the non-volatile memory 104 to be stored at the respective logical page of each of the one or more storage elements.

The non-volatile memory 104 may program the one or more storage elements based on the dummy data, the first data, and the second data. For example, the non-volatile memory 104 may use the bit to state mapping circuitry 110 to determine a voltage state of each of the one or more storage elements based on the dummy data, the first data, and the second data. The non-volatile memory 104 may set each of the one or more storage elements to a corresponding voltage state determined by the bit to state mapping circuitry 110.

Based on a particular bit per storage element storage scheme, dummy data may be provided to one or more locations of the non-volatile memory 104 to prevent one or more storage elements from being programmed to a particular voltage state of multiple voltage states. When the particular voltage state includes a highest voltage state of the multiple voltage states, preventing the one or more storage elements from being programmed to a highest voltage state may reduce a state capacitance between adjacent storage elements. Alternatively or additionally, one or more parameters associated with the block may be tracked. Based on the one or more parameters, the bit per storage element selection engine 122 may initiate a change of the particular bit per storage element storage scheme applied to the block 280 from a first storage scheme to a second storage scheme. The change of the particular bit per storage element storage scheme may cause a particular storage element operating as a single bit storage element to change to operating as a multi bit storage element. Accordingly, a number of bits stored at the particular storage element may be varied to prevent the particular storage element from being used exclusively as a single bit storage element.

Figure 3:
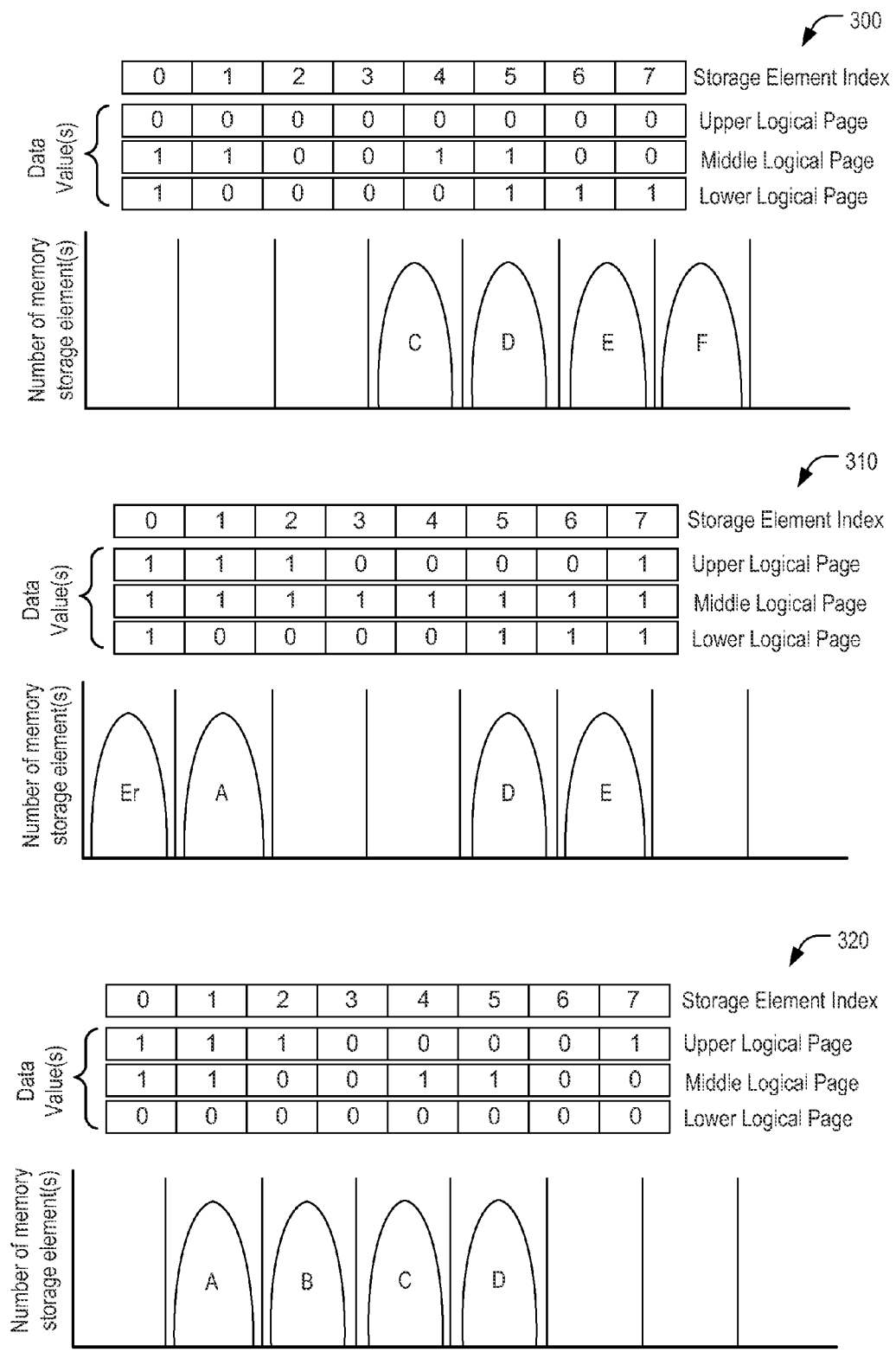
FIG. 3 depicts illustrative embodiments of different voltage states that may be programmed in a 3 bit storage element that is used as a 2 bit storage element.

FIG. 3 depicts multiple embodiments of voltage states that may be programmed at a storage element when a 3 bit storage element is used as a 2 bit storage element by providing dummy data to a single logical page of the 3 bit storage element. Each of the multiple embodiments further depicts data values provided to 3 bit storage elements (indexed 0-7) to illustrate data values including dummy data that may be provided from a controller to a memory. The dummy data, such as the dummy data 124 (e.g., the first dummy data 125 or the second dummy data 127), may be generated by the controller 120 and may be included in the data 128 provided to the non-volatile memory 104 of FIG. 1.

In a first embodiment 300, 3 bit storage elements are used as 2 bit storage elements by providing first dummy data to an upper logical page of the 3 bit storage elements. In the first embodiment 300, the first dummy data includes the bit value of zero in an upper logical page of the 3 bit storage elements. Accordingly, when a controller provides first data, including the first dummy data, to be stored at a particular storage element of a memory, the first data may include data values of "0 1 1", "0 1 0", "0 0 0", or "0 0 1". Based on the first data provided to the memory, the memory may program the storage element using a 3 bit mapping of bits to states, such as the 3 bit mapping of bits to states 160 of FIG. 1. When the first data includes the first dummy data, the memory may program the storage element to one of the voltage states "C", "D", "E", or "F". For example, when the first data has a first data value of "0 1 1", the memory may program the storage element to the voltage state "E". As another example, when the first data has a second data value of "0 1 0", the memory may program the storage element to the voltage state "D". As another example, when the first data has a third data value of "0 0 0", the memory may program the storage element to the voltage state "C". As another example, when the first data has a fourth data value of "0 0 1", the memory may program the storage element to the s voltage tate "F".

In a second embodiment 310, 3 bit storage elements are used as 2 bit storage elements by providing second dummy data having a bit value of one in a middle logical page of the 3 bit storage elements. Accordingly, when a controller provides second data, including the second dummy data, to be stored at a storage element of a memory, the second data may have data values of "1 1 1", "1 1 0", "0 1 0", or "0 1 1". Based on the second data provided to the memory, the storage element may be programmed to one of the voltage states "Er", "A", "D", or "E" using a 3 bit mapping of bits to states, such as the 3 bit mapping of bits to states 160 of FIG. 1.

In a third embodiment 320, 3 bit storage elements are used as 2 bit storage elements by providing third dummy data having a bit value of zero in a lower logical page of the 3 bit storage element. Accordingly, when a controller provides third data, including the third dummy data, to be stored at a storage element of a memory, the third data may have data values of "1 1 0", "1 0 0", "0 0 0", or "0 1 0". Based on the third data, the storage element may be programmed to one of the voltage states "A", "B", "C", or "D" using a 3 bit mapping of bits to states, such as the 3 bit mapping of bits to states 160 of FIG. 1.

One or more particular voltage states are prevented from being programmed to the storage element when the controller includes dummy data along with data to be stored at the storage element of the memory. For example, a highest voltage state, a voltage state "G", is prevented from being programmed to the storage element when the controller includes dummy data along with data to be stored at the storage element of the memory. Although none of the embodiments 300-320 program the storage element to the highest voltage state (i.e., the voltage state "G"), other embodiments may include programming of the storage element to the highest voltage state, when the dummy data is included along with the data to be stored at the storage element.

When the controller includes dummy data with data to be stored at the storage element of the memory after erasing the storage elements to be in a lowest voltage state, e.g., a voltage state "Er" (erase), all storage elements may be programmed from (i.e., not remain in) the "Er" voltage state based on the data that includes the dummy data. However, the controller may still provide a data value corresponding to the lowest voltage states, such as an all-ones data value, to maintain the storage element in the erase state. For example, in the first embodiment 300 and the third embodiment 320, the controller may send a data value of "1 1 1" (corresponding to a voltage state "Er" (erase)) to maintain erase data (e.g., writing "1" values) in each page of the storage element.

Figure 4:
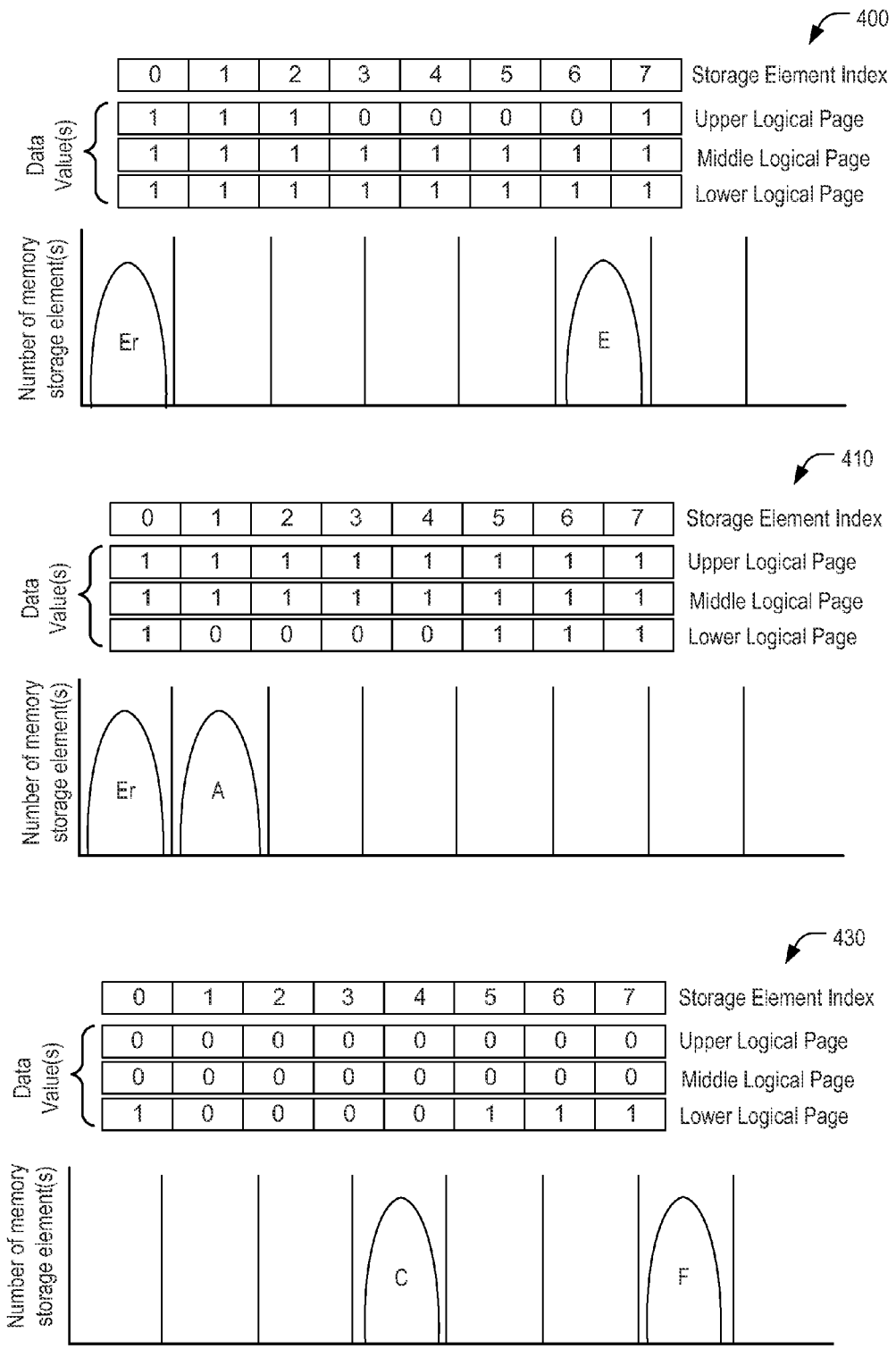
FIG. 4 depicts illustrative embodiments of different voltage states that may be programmed in a 3 bit storage element that is used as a 1 bit storage element.

FIG. 4 depicts embodiments of voltage states that may be programmed at a storage element when a 3 bit storage element is used as a 1 bit storage element by providing dummy data to two logical pages of the 3 bit storage element. Each of the embodiments further depicts data values provided to 3 bit storage elements (indexed 0-7) to illustrate data values, including the dummy data in two particular logical pages, that may be provided from a controller to a memory. The dummy data, such as the dummy data 124 (e.g., the first dummy data 125 or the second dummy data 127), may be generated by the controller 120 and included in the data 128 provided to the non-volatile memory 104 of FIG. 1.

In a first embodiment 400, 3 bit storage elements are used as 2 bit storage elements by providing first dummy data having a bit value of 1 to a middle logical page and to a lower logical page of the 3 bit storage element. In the first embodiment 400, the first dummy data having the bit value of 1 in the middle logical page and the lower logical page of the 3 bit storage elements. Accordingly, when a controller provides first data, including the first dummy data, to be stored at a storage element of a memory, the first data may include data values of "1 1 1" or "0 1 1". Based on the first data provided to the memory, the memory may program the storage element using a 3 bit mapping of bits to states, such as the 3 bit mapping of bits to states 160 of FIG. 1. When the first data includes the first dummy data, the storage element may be programmed to one of the voltage states "Er" or "E". For example, when the first data has a first data value of "1 1 1", the storage element may have the voltage state "Er". As another example, when the first data has a second data value of "0 1 1", the memory may program the storage element to the voltage state "E".

In a second embodiment 410, 3 bit storage elements are used as 2 bit storage elements by providing second dummy data having a bit value of one in an upper logical page and a middle logical page of the 3 bit storage elements. Accordingly, when a controller provides second data, including the second dummy data, to be stored at a storage element of a memory, the second data may have data values of "1 1 1" or "1 1 0". Based on the second data provided to the memory, the storage element may be at either the voltage state "Er" or the voltage state "A" using a 3 bit mapping of bits to states, such as the 3 bit mapping of bits to states 160 of FIG. 1.

In a third embodiment 430, 3 bit storage elements are used as 2 bit storage elements by providing third dummy data having a bit value of zero in an upper logical page and a middle logical page of the 3 bit storage elements. Accordingly, when a controller provides third data, including the third dummy data, to be stored at a storage element of a memory, the third data may include data values of "0 0 0" or "0 0 1". Based on the third data, the storage element is programmed to one of the voltage states "C" or "F" using the 3 bit mapping of bits to states 160 of FIG. 1. It is noted that when the controller provides the third data including the third dummy data having the bit value of zero in the upper logical page and the middle logical page, storage elements are prevented from remaining in the erase voltage state (i.e., a voltage state "Er" (erase) is prohibited). The controller may still provide a data value corresponding to the lowest voltage states, such as an all-ones data value, to maintain erase data (e.g., writing "1" values) in each page of the storage element.

One or more particular voltage states are prevented from being programmed to the storage element when the controller includes dummy data along with data to be stored at the storage element of the memory. For example, a highest voltage state (e.g., a state "G") is prevented from being programmed to the storage element based on the dummy data as described in the embodiments 400-430. Although none of the embodiments 400-430 program the storage element to the highest voltage state, other embodiments may include programming of the storage element to the highest voltage state when the controller includes dummy data with data to be stored at the storage element of the memory.

Figure 5:
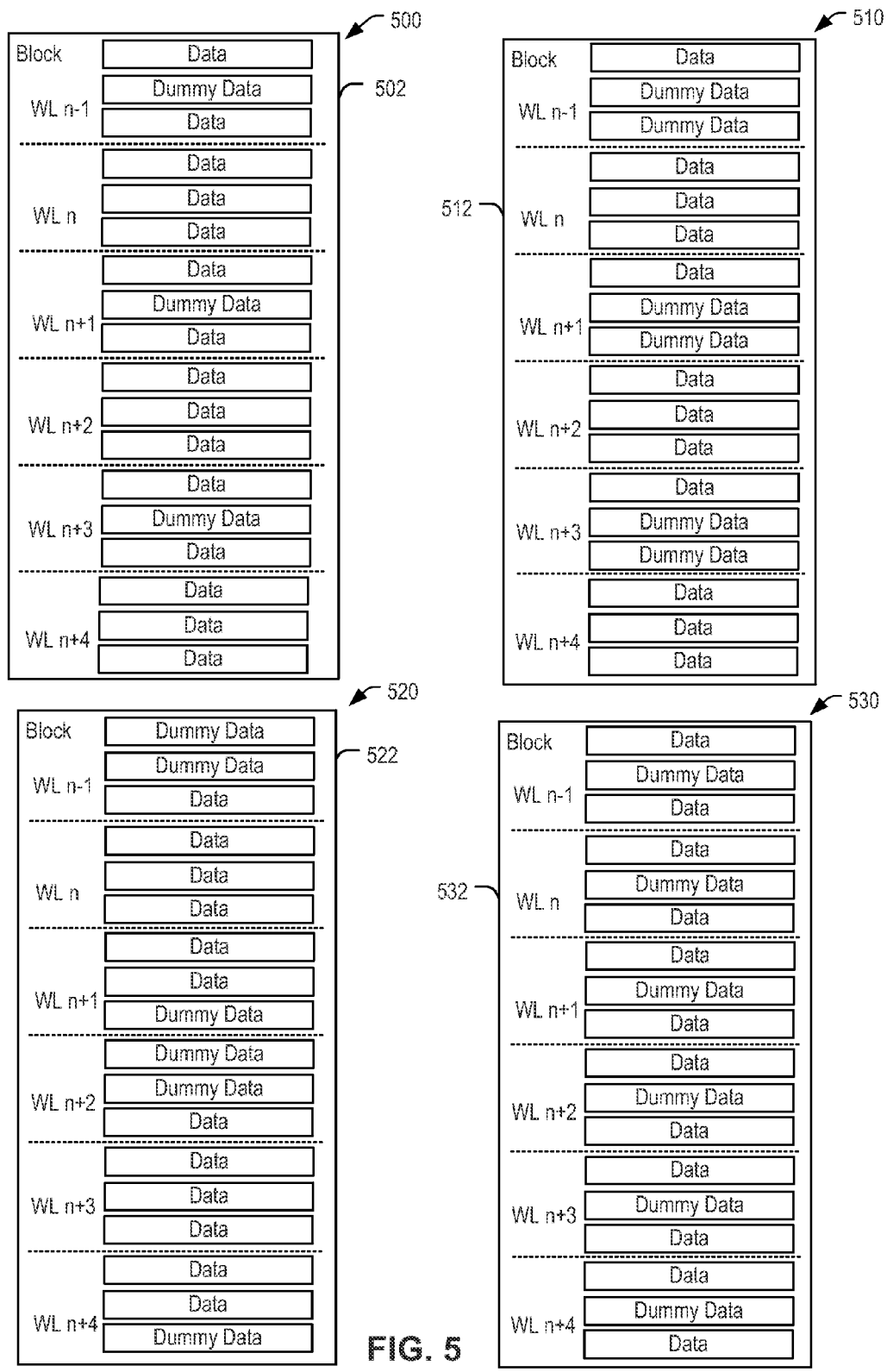
FIG. 5 depicts illustrative embodiments of different block storage schemes that may be applied to a block of a memory.

FIG. 5 depicts illustrative embodiments of blocks that each store data based on a corresponding block storage scheme. Each of the blocks may include a plurality of word lines, such as a first word line WLn−1, a second word line WLn, a third word line WLn+1, a fourth word line WLn+2, a fifth word line WLn+3, and a sixth word line WLn+4. Each of the word lines may include at least one 3 bit storage element associated with an upper logical page, a middle logical page, and a lower logical page.

Each of the block storage schemes may identify a pattern of bits per storage element to be applied to a block of a memory, such as the block 280 of the non-volatile memory 104. For example, each of the block storage schemes may be included in the bit per storage element storage scheme(s) 226 of FIG. 2. A pattern of a particular block storage scheme may be applied throughout one or more blocks. At least one word line of the plurality of word lines associated with the pattern may include dummy data, such as the dummy data 124 of FIG. 1.

In a first embodiment 500, a first block storage scheme has been applied to a first block 502. When the first block storage scheme is applied, alternating word lines of the block 502 may store dummy data in a single corresponding logical page. For example, the first block storage scheme may cause the dummy data to be stored at a middle logical page of alternating word lines. As depicted in the first embodiment 500, dummy data is stored at the middle logical page of the first word line WLn−1, the third word line WLn+1, and the fifth word line WLn+3 of the block 502, while user data is stored at the upper page and the lower page in the first word line WLn−1, the third word line WLn+1, and the fifth word line WLn+3 of the block 502. As depicted in the first embodiment 500, user data is stored at each of the logical pages of the second word line WLn, the fourth word line WLn+2, and the sixth word line WLn+4 of the block 502.

In a second embodiment 510, a second block storage scheme has been applied to a second block 512. When the second block storage scheme is applied, alternating word lines may store dummy data in two corresponding logical pages. For example, the first block storage scheme may cause first dummy data to be stored at a middle logical page and second dummy data to be stored at a lower logical page of alternating word lines. As depicted in the second embodiment 510, dummy data is stored at the middle logical page and the lower logical page of the first word line WLn−1, the third word line WLn+1, and the fifth word line WLn+3 of the second block 512, while user data is stored at the upper page in the first word line WLn−1, the third word line WLn+1, and the fifth word line WLn+3 of the second block 512. As depicted in the second embodiment 510, user data is stored at each of the logical pages of the second word line WLn, the fourth word line WLn+2, and the sixth word line WLn+4 of the second block 512.

In a third embodiment 520, a third block storage scheme has been applied to a third block 522. The third block storage scheme may identify a pattern including three word lines. A first word line of the pattern may include dummy data in an upper logical page and a middle logical page of the first word line, a second word line may not include any dummy data, and a third word line may include dummy data in a lower logical page. As depicted in the third embodiment 520, the first word line WLn−1, the second word line WLn, and the third word line WLn+1 may be associated with a first instance of the pattern, and the fourth word line WLn+2, the fifth word line WLn+3, and the sixth word line WLn+4 may be associated with a second instance of the pattern.

In a fourth embodiment 530, a fourth block storage scheme has been applied to a fourth block 532. When the fourth block storage scheme is applied, each word line of the fourth block 532 may store dummy data in a single corresponding logical page. For example, the fourth block storage scheme may cause the dummy data to be stored at a middle logical page of each word line. As depicted in the fourth embodiment 530, dummy data is stored at the middle logical page, while user data is stored at the upper page and the lower page, of the first word line WLn−1, the second word line WLn, the third word line WLn+1, the fourth word line WLn+2, the fifth word line WLn+3, and the sixth word line WLn+4 of the block 532.

Although four illustrative block storage schemes including corresponding patterns have been described, other block storage schemes may be used. For example, block storage schemes are not limited to blocks including storage elements that may store a total of 3 bits per storage element. Block storage schemes may be used and applied to blocks including storage elements that include 2 or more bits per storage element.

Figure 6:
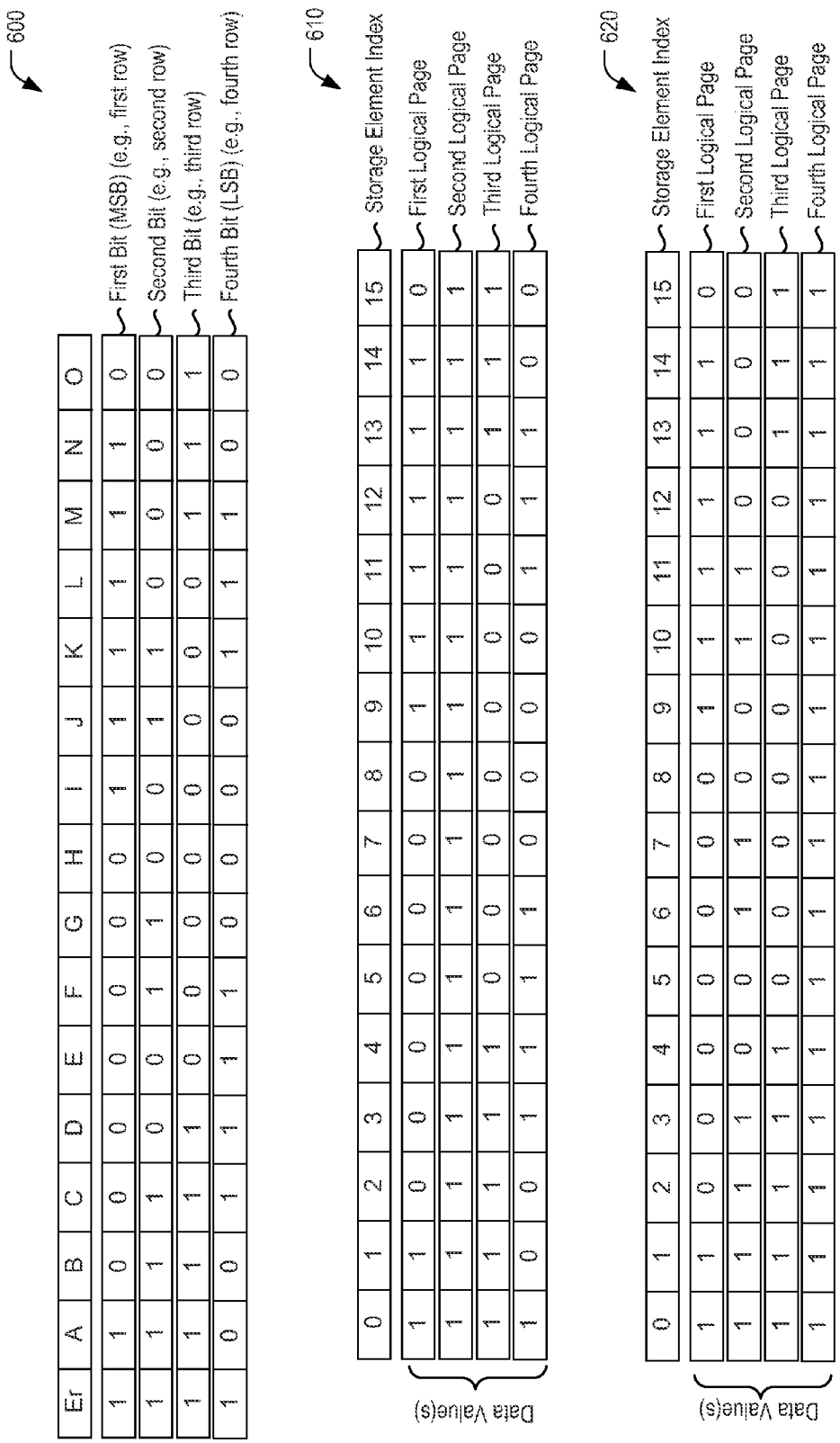
FIG. 6 depicts an illustrative embodiment of a 4 bit mapping of bits to states and illustrative embodiments of modified 4 bit mappings of bits to states to illustrate use of a 4 bit storage element as a 3 bit storage element.

FIG. 6 depicts an embodiment of a 4 bit mapping of bits to states and depicts two embodiments of 4 bit storage elements (indexed 0-15) to illustrate data values including dummy data that may be provided from a controller to a memory.

A particular embodiment of the 4 bit mapping of bits to states is depicted at 600. The 4 bit mapping of bits to states 600 may correspond to or may be included in the bit to state mapping circuitry 110 that is used by the non-volatile memory 104 of FIG. 1. The 4 bit mapping of bits to states 600 may be applied to a 4-bit storage element. For example, the 4-bit storage element may correspond to one of the storage elements C0-Cn of FIG. 1. The storage element may store a bit value associated with a set of bits, such as a first bit, a second bit, a third bit, and a fourth bit. The first bit may correspond to a most significant bit (MSB) of the data value and the fourth bit may correspond to a least significant bit (LSB) of the data value. As depicted in FIG. 6, the 4 bit mapping of bits to states 600 illustrates 3-5-2-5 encoding implemented by a memory, such as the non-volatile memory 104 of FIG. 1. The 3-5-2-5 encoding indicates that a first row associated with the first bit includes 3 transitions from 0→1 or 1→0, a second row associated with the second bit includes 5 transitions, a third row associated with the third bit includes 2 transitions, and a fourth row associated with the fourth bit includes 5 transitions.

The 4-bit storage element may be programmed to one of sixteen predefined voltage states. For example, the 4 bit mapping of bits to states 600 includes a set of 16 possible states, e.g., threshold voltage ranges, such as "Er" (erase), "A", "B", "C", "D", "E", "F", "G", "H", "I", "J", "K", "L", "M", "I", and "O". Each of the sixteen predefined voltage states may be mapped to a particular bit value as indicated by the set of logical pages as depicted in the 4 bit mapping of bits to states 600. To illustrate a correspondence between the set of possible voltage states and the particular bit values, a particular storage element may store a first value of "1 1 1 0" that corresponds to the voltage state "A". To further illustrate a correspondence between the set of possible voltage states and the particular bit values, the particular storage element may store a second value of "1 1 0 1" that corresponds to the voltage state "K".

A first embodiment 610 and a second embodiment 620 each depict 4 bit storage elements (indexed 0-15) to illustrate data values that may be provided from a controller to a memory when the 4 bit storage elements are used as 3 bit storage elements by providing dummy data to a single logical page of the 4 bit storage elements. The dummy data, such as the dummy data 124, may be generated by the controller 120 and included in the data 128 provided to the non-volatile memory 104 of FIG. 1.

In the first embodiment 610, 4 bit storage elements are used as 3 bit storage elements by providing first dummy data to a single logical page of the 4 bit storage elements. In the first embodiment 610, the 4 bit storage elements include first dummy data including a bit value of one in a second logical page of the 4 bit storage elements. Accordingly, when a controller provides first data, including the first dummy data, to be stored at a storage element of a memory, the first data may include data values of "1 1 1 1", "1 1 1 0", "0 1 1 0", "0 1 1 1", "0 1 0 1", "0 1 0 0", "1 1 0 0", or "1 1 0 1". When the first data includes the first dummy data, the memory may program the storage element to one of the voltage states "Er", "A", "B", "C", "F", "G", "J", or "K".

In the second embodiment 620, 4 bit storage elements are used as 3 bit storage elements by providing second dummy data including a bit value of one in a fourth logical page of the 4 bit storage elements. Accordingly, when a controller provides second data, including the second dummy data, to be stored at a storage element of a memory, the second data may have data values of "1 1 1 1", "0 1 1 1", "0 0 1 1", "0 0 0 1", "0 1 0 1", "1 0 0 1", "1 1 0 1", or "1 0 1 1". When the first data includes the first dummy data, the memory may program the storage element to one of the voltage states "Er", "C", "D", "E", "F", "K", "L", or "M".

It is noted that one or more particular voltage states are prevented from being programmed to the storage element when the controller includes dummy data along with data to be stored at the storage element of the memory. For example, a highest voltage state (e.g., a voltage state "O" corresponding to a data value of "0 0 1 0") is prevented from being programmed to the storage element when the controller includes dummy data with data to be stored at the storage element of the memory. Although neither the first embodiment 610 or the second embodiment 620 program the storage element to the highest voltage state, other embodiments may include programming of the storage element to the highest voltage state, when the controller includes dummy data in data to be stored at the storage element of the memory.

It is further noted that although the first embodiment 610 and the second embodiment 620 may include a particular storage element having a lowest voltage state, a voltage state "Er", other embodiments of a 4 bit storage element used as a 3 bit storage element, a 2 bit storage element, or a 1 bit storage element may prevent a data value corresponding to the lowest voltage state from being provided to the memory when the controller includes dummy data as part of a data value to be programmed. In such embodiments, the controller may still provide a data value corresponding to the lowest voltage states, such as an all-ones data value of "1 1 1 1", to maintain erase data in all pages of the storage element.

As illustrated with respect to FIGS. 3-4, a bit value of dummy data may be provided to a particular logical page of a storage element and may be determined based on a value of a particular voltage state, such as a highest voltage state, of the particular logical page of a bit to state mapping. For example, when the particular voltage state is the highest voltage state, the bit value of the dummy data in a particular logical page may be a different value than the bit value of the logical page in the highest voltage state so that the highest voltage state is prevented from being programmed into a storage element that receives the dummy data. To illustrate, referring to the 4 bit mapping of bits to states 600, a bit value of the second bit of the data value corresponding to the highest voltage state (i.e., the "O" voltage state) is zero. Accordingly, in the first embodiment 610, the first dummy data has a bit value of 1 supplied to the second logical page to prevent the highest voltage state (i.e., the "O" voltage state) from being programmed. When multiple logical pages are selected to receive dummy data, at least one logical page of the multiple logical pages may have a dummy bit value that is a different value than a bit value of a highest voltage state of the at least one logical page. This methodology may be applied when determining a value of dummy data to be used in conjunction with any size bit to state mapping or may be applied to prevent programming of any particular voltage state.

Alternatively or additionally, a logical page to receive dummy data may be determined based on a particular logical page of a bit to state mapping that includes a highest number of transitions. For example, referring to the 4 bit mapping of bits to states 600, the first row includes 3 transitions from 0→1 or 1→0, the second row includes 5 transitions, the third row includes 2 logical transitions, and the fourth row includes 5 transitions. Accordingly, in the first embodiment 610, the 4 bit storage elements include the first dummy data in the second logical page and, in the second embodiment 620, the 4 bit storage elements include the second dummy data in the fourth logical page. In a particular embodiment, when multiple logical pages are selected to receive dummy data, at least one logical page of the multiple logical pages may be selected to have dummy data based on a number of transitions of each of the multiple logical pages in a mapping of bits to states. For example, a particular mapping of bits to states, such as the 3 bit mapping of bits to states 160 of FIG. 1 or another mapping of bits to states associated with any number of bits, may be selected. Each logical page of the particular mapping of bits to states may be analyzed to determine a number of transitions. A particular logical page having a highest number of transitions may be selected to receive dummy data. This methodology may be applied when determining a value of dummy data to be used in conjunction with any size bit to state mapping. For example, the controller 120 may select the particular mapping of bits to states, analyze each logical page of the particular mapping of bits to states, and select the particular logical page to receive the dummy data. The controller 120 may use the bit per storage element selection engine 122, the bit per storage element storage scheme(s) 226, or a combination thereof, to implement the methodology (e.g., a process).

Figure 7:
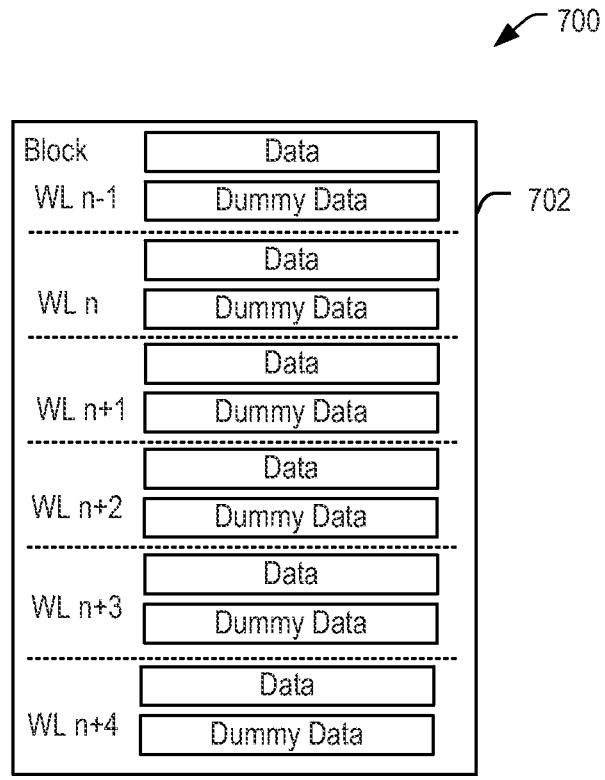
FIG. 7 depicts an illustrative embodiment of a block storage scheme that may be applied to a block of a memory.

FIG. 7 depicts an illustrative embodiment 700 of a block 702 that stores data based on a corresponding block storage scheme. The block 702 may include a plurality of word lines, such as a first word line WLn−1, a second word line WLn, a third word line WLn+1, a fourth word line WLn+2, a fifth word line WLn+3, and a sixth word line WLn+4. Each of the word lines may include at least one 2 bit storage element associated with an upper logical page and a lower logical page.

The block storage scheme may identify a pattern of bits per storage element to be applied to a block of a memory, such as the block 280 of the non-volatile memory 104. For example, the block storage scheme may be included in the bit per storage element storage scheme(s) 226 of FIG. 2. A pattern of a particular block storage scheme may be applied throughout one or more blocks. At least one word line of the plurality of word lines associated with the pattern may include dummy data, such as the dummy data 124 of FIG. 1.

In the illustrative embodiment 700, a particular block storage scheme has been applied to the block 702. When the particular block storage scheme is applied, each word line of the block 702 may store dummy data in a single corresponding logical page. For example, the particular block storage scheme may cause the dummy data to be stored at a lower logical page of each word line. As depicted in the illustrative embodiment 700, dummy data is stored at the lower logical page of the illustrated word lines, while user data is stored at the upper page in the word lines.

Although an illustrative block storage scheme including a corresponding pattern has been described, other block storage schemes may be used. For example, block storage schemes are not limited to blocks including storage elements that may store a total of 2 bits per storage element. Block storage schemes may be used and applied to blocks including storage elements that include 2 or more bits per storage element.

Figure 8:
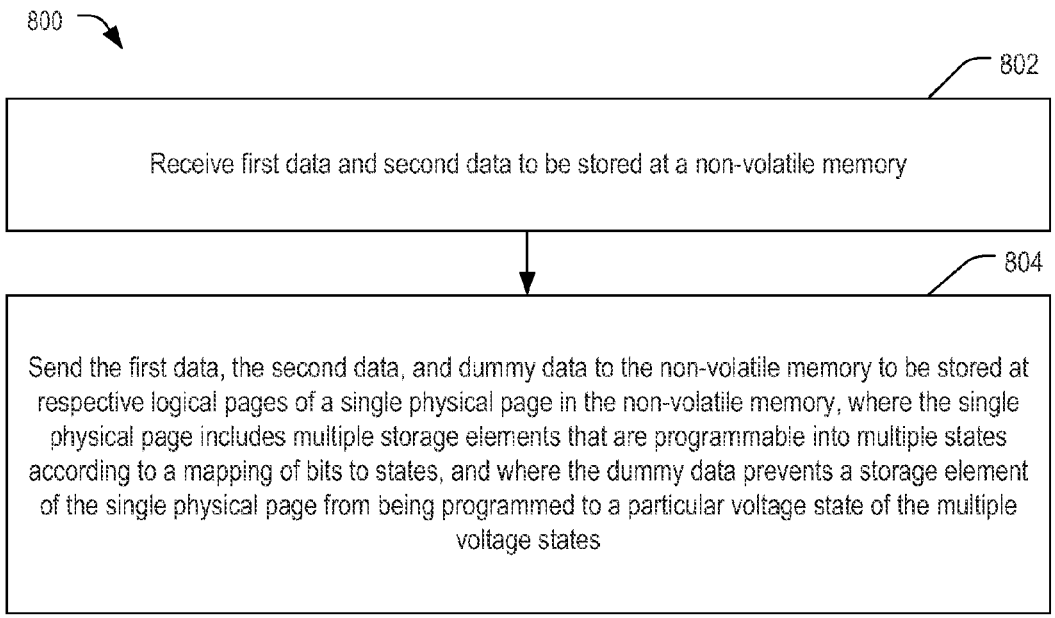
FIG. 8 is a flow chart of a first illustrative embodiment of a method of storing data at a multi-bit storage element.

Referring to FIG. 8, a first particular embodiment of a method 800 of selecting a number of bits per storage element to be stored at a multi-bit storage element is depicted. The method 800 may be performed in a data storage device that includes a controller and a non-volatile memory. The non-volatile memory may include a group of storage elements that are programmable to a set of voltage states. Each voltage state of the set of voltage states may correspond to a range of threshold voltage values, such as in an implementation of a MLC flash memory device. For example, the method 800 may be performed in the data storage device 102 of FIG. 1.

The method 800 includes receiving first data and second data to be stored at the non-volatile memory, at 802. The first data and the second data may be included in user data, such as the data 132 of FIG. 1. The first data and the second data may be received at a controller of the data storage device, such as the controller 120 of FIG. 1. To illustrate, the first data and the second data may correspond to data to be stored at the upper logical page 166 and the lower logical page 170 of FIG. 1, respectively.

The method 800 includes sending the first data, the second data, and dummy data to the non-volatile memory to be stored at respective logical pages of a single physical page in the non-volatile memory, where the single physical page includes multiple storage elements that are programmable into multiple voltage states according to a mapping of bits to states, and where the dummy data prevents a storage element of the single physical page from being programmed to a particular voltage state of the multiple voltage states, at 804. For example, the particular voltage state may be a highest voltage state of the multiple voltage states. The dummy data may be generated by a bit per storage element selection engine of the controller, such as the bit per storage element selection engine 122 of FIG. 1. The multiple storage elements may correspond to the group of storage elements 106 of FIG. 1.

In some implementations, the controller may receive third data, fourth data, and fifth data to be stored at the non-volatile memory. The third data, the fourth data, and the fifth data may be received subsequent to or concurrently with the first data and the second data. For example, the controller 120 may send the third data, the fourth data, and the fifth data to the non-volatile memory 104 to be stored at the non-volatile memory 104 at a physical page that is adjacent to the single physical page. For example, when the non-volatile memory 104 stores the first data in the second logical page 286 of FIG. 2 and stores the second data in the third logical page 288 of the first word line WLn−1, the third data, the fourth data, and the fifth data may be stored at the fourth logical page 294, the fifth logical page 296, and the sixth logical page 298, respectively, of the second word line WLn that is an adjacent word line to the first word line WLn−1.

In other implementations, the bit per storage element storage scheme, such as one of the bit per storage element schemes 226 of FIG. 2, may include a block storage scheme, a word line storage scheme, or a combination thereof. For example, the bit per storage element selection engine 122 may select a number of bits per storage element to be stored at the multiple storage elements of the single physical page. Based on the selected number of bits per storage element, the bit per storage element selection engine 122 may generate the dummy data to be sent along with the first data and the second data to the single physical page.

Figure 9:
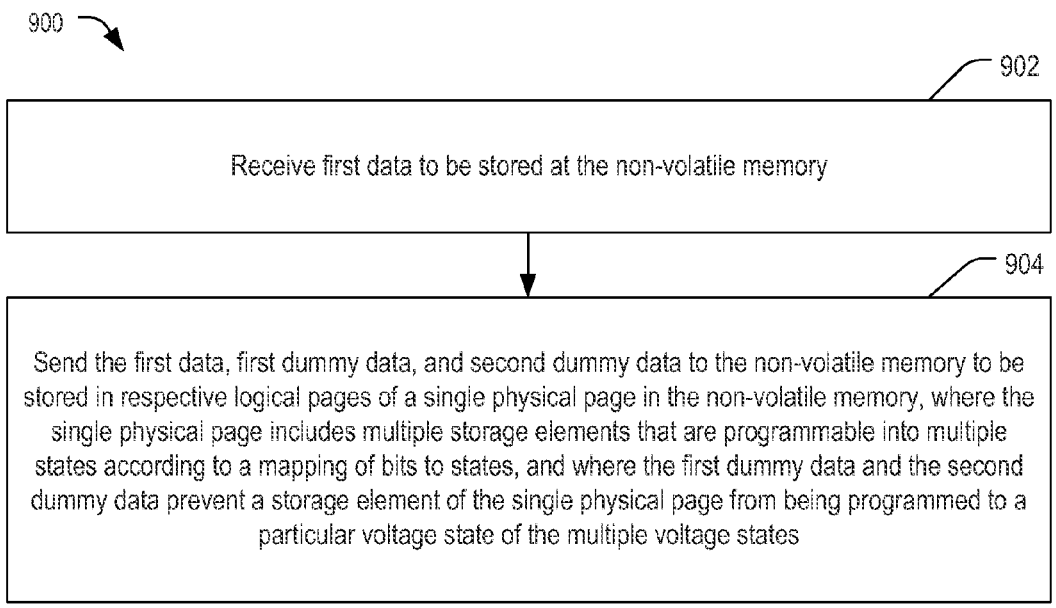
FIG. 9 is a flow chart of a second illustrative embodiment of a method of storing data at a multi-bit storage element.

Referring to FIG. 9, a second particular embodiment of a method 900 of selecting a number of bits per storage element to be stored at a multi-bit storage element is depicted. The method 900 may be performed in a data storage device that includes a controller and a non-volatile memory. The non-volatile memory may include a group of storage elements that are programmable to a set of voltage states. Each voltage state of the set of voltage states may correspond to a range of threshold voltage values, such as in an implementation of a MLC flash memory device. For example, the method 900 may be performed in the data storage device 102 of FIG. 1.

The method 900 includes receiving first data to be stored at the non-volatile memory, at 902. The first data may be included in user data received at a data storage element, such as the data 132 received at the data storage element 102 of FIG. 1. The first data and the second data may be received at a controller of the data storage device. The controller may correspond to the controller 120 of FIG. 1.

The method 900 includes sending the first data, first dummy data, and second dummy data to the non-volatile memory to be stored at respective logical pages of a single physical page in the non-volatile memory, at 904. The single physical page includes multiple storage elements that are programmable into multiple voltage states according to a mapping of bits to states, and the first dummy data and the second dummy data prevent a storage element of the single physical page from being programmed to a particular voltage state of the multiple voltage states. For example, the particular voltage state may be a highest voltage state of the multiple voltage states. The first dummy data and the second dummy data may be generated by a bit per storage element selection engine of the controller, such as the bit per storage element selection engine 122 of FIG. 1. The mapping of bits to states may be applied at the non-volatile memory, such as the 3 bit mapping of bits to states 160 used at the non-volatile memory 104 of FIG. 1. The multiple storage elements may correspond to the group of storage elements 106 of FIG. 1. The first dummy data and the second dummy data may correspond to the dummy data 124 of FIG. 1, such as the all-ones dummy data illustrated in the middle logical page and the lower logical page in the first embodiment 400 of FIG. 4, the all-ones dummy data illustrated in the upper logical page and the middle logical page in the second embodiment 410 of FIG. 4, or the all-zeros dummy data in the upper logical page and the middle logical page of the third embodiment 430 of FIG. 4, as illustrative, non-limiting examples.

In some implementations, the bit per storage element storage scheme, such as one of the bit per storage element schemes 226 of FIG. 2, may include a block storage scheme, a word line storage scheme, or a combination thereof. For example, the bit per storage element selection engine 122 may select a number of bits per storage element to be stored at the multiple storage elements of the single physical page. Based on the selected number of bits per storage element, the bit per storage element selection engine 122 may generate the dummy data to be sent along with the first data and the second data to the single physical page.

In other implementations, the controller may receive second data, third data, and fourth data to be stored at the non-volatile memory, such as the controller 120 receiving the data 132 including the second data, the third data, and the fourth data to be stored at the non-volatile memory 104 of FIG. 1. The second data, the third data, and the fourth data may be received subsequent to or concurrently with the first data. The controller 120 may send the second data, the third data, and the fourth data to the non-volatile memory 104 to be stored at the non-volatile memory 104 at a physical page that is adjacent to the single physical page. For example, when first data is stored at a first physical page associated with a first word line, such as the first word line WLn−1 of the second block 512 of the second embodiment 510 or the first word line WLn−1 of the third block 522 of the third embodiment 520 of FIG. 5, the second data, the third data, the fourth data may be stored at a second physical page associated with a second word line, such as the second word line WLn of the second block 512 of the second embodiment 510 or the second word line WLn of the third block 522 of the third embodiment 520 of FIG. 5, that is adjacent to the first physical page.

Although various components depicted herein are illustrated as block components and described in general terms, such components may include one or more microprocessors, state machines, or other circuits configured to enable the controller 120 of FIG. 1 to select a number of bits per storage element to be stored at a multi-bit storage element. Alternatively or additionally, the components may include one or more microprocessors, state machines, or other circuits configured to enable the controller 120 of FIG. 1 to selectively provide dummy data to prevent the multi-bit storage element from being programmed to a particular voltage state (e.g., a highest voltage state) of multiple voltage states. For example, the controller 120 may represent physical components, such as hardware controllers, state machines, logic circuits, or other structures, to enable the controller 120 of FIG. 1 to select a number of bits per storage element to be stored at a multi-bit storage element. As another example, the controller 120 may represent physical components, such as hardware controllers, state machines, logic circuits, or other structures, to enable the controller 120 of FIG. 1 to generate dummy data. As a further example, the controller 120 may represent physical components, such as hardware controllers, state machines, logic circuits, or other structures, to enable the controller 120 of FIG. 1 to send the dummy data to the multi-bit storage element to prevent the multi-bit storage element from being programmed to a highest voltage state of multiple voltage states.

The controller 120 may be implemented using a microprocessor or microcontroller programmed to perform the method 800 of FIG. 8, the method 900 of FIG. 9, or a combination thereof. In a particular embodiment, the microprocessor or the microcontroller is programmed to select a particular bit per storage element storage scheme from one or more bit per storage element storage scheme(s), such as the bit per storage element storage scheme(s) 226, to be applied to a memory. The microprocessor or microcontroller may further be programmed to receive user data, such as the data 132 of FIG. 1, to be stored at the memory. The microprocessor or microcontroller may further be programmed to determine a location, such as a particular word line or a particular physical page, of the memory in which the user data is to be stored. The microprocessor or microcontroller may further be programmed to select a number of bits to be stored at each of one or more storage elements associated with the location. The microprocessor or microcontroller may further be programmed to determine which, if any, of the logical pages of the one or more storage elements are to receive dummy data and when the at least one logical page is determined to receive the dummy data. The microprocessor or microcontroller may further be programmed to send the dummy data and the user data to the memory to be stored at the respective logical page of each of the one or more storage elements. In a particular embodiment, the controller includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be attached or embedded within one or more host devices, such as within a housing of a host communication device. However, in other embodiments, the data storage device 102 may be implemented in a portable device configured to be selectively coupled to one or more external devices. For example, the data storage device 102 may be within a packaged apparatus such as a wireless telephone, a tablet computer, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
 a non-volatile memory including a plurality of physical pages, each physical page including multiple storage elements that are programmable into multiple voltage states according to a mapping of bits to states, wherein the non-volatile memory includes a three-dimensional (3D) memory and circuitry associated with operation of memory cells of the 3D memory; and
 a controller coupled to the non-volatile memory, the controller configured to:
  receive first data to be stored on the non-volatile memory; and
  send the first data, first dummy data, and second dummy data to the non-volatile memory to be stored at respective logical pages of a single physical page in the non-volatile memory,
  wherein the controller is configured to determine the first dummy data and the second dummy data to reduce a cross-coupling effect between a particular storage element of the single physical page and storage elements adjacent to the particular storage element by preventing the particular storage element of the single physical page from being programmed to a highest voltage state of the multiple voltage states, wherein the non-volatile memory includes a block having multiple word lines, and wherein the controller is configured to send dummy data to alternating word lines of the multiple word lines within the block, wherein the dummy data includes the first dummy data and the second dummy data.

2. The data storage device of claim 1, wherein the controller is configured to store one or more bit per storage element storage schemes, wherein a bit per storage element storage scheme indicates a number of data bits, a number of dummy bits, or a combination thereof, to be stored at the single physical page.

3. The data storage device of claim 1, wherein the controller is configured to select a bit per storage element storage scheme to be applied to the single physical page, wherein the bit per storage element storage scheme is a block storage scheme or a word line storage scheme.

4. The data storage device of claim 1, wherein the controller is configured to track a bit per storage element storage scheme applied to the single physical page.

5. The data storage device of claim 1, wherein the controller is configured to generate the first dummy data and the second dummy data responsive to a selection to assign a single logical page of user data to the single physical page and wherein the controller is further configured to select the first dummy data and the second dummy data to reduce wearing of the storage elements of the single physical page by reducing a capacitance associated with the storage elements of the single physical page.

6. The data storage device of claim 1, wherein the controller is configured to:
track one or more parameters associated with the single physical page; and
select a bit per storage element storage scheme for the single physical page based on the one or more parameters.

7. The data storage device of claim 1, wherein the single physical page includes an upper logical page, a middle logical page, and a lower logical page, wherein the first dummy data or the second dummy data is stored at the middle logical page, and wherein the first dummy data and the second dummy data prevent the particular storage element of the single physical page from being programmed to the highest voltage state of the multiple voltage states and from being programmed to a second highest voltage state of the multiple voltage states by prohibiting a first data value corresponding to the highest voltage state from being stored at the particular storage element and by prohibiting a second data value corresponding to the second highest voltage state from being stored at the particular storage element.

8. The data storage device of claim 1, wherein the block includes a plurality of physical pages.

9. The data storage device of claim 1, wherein each storage element stores a corresponding data value including a plurality of bits.

10. The data storage device of claim 1, wherein the non-volatile memory includes a flash memory.

11. A device comprising:
a non-volatile memory including a three-dimensional (3D) memory and circuitry associated with operation of memory cells of the 3D memory; and
a controller coupled to the non-volatile memory, wherein the controller is configured to:
receive first data to be stored at the non-volatile memory; and
send the first data and dummy data to the non-volatile memory to be stored at logical pages of multiple word lines in the non-volatile memory so that the dummy data is sent to alternating word lines of the multiple word lines and so that word lines that receive the dummy data store a portion of the dummy data in first logical pages and store a portion of the first data in a second logical page,
wherein the dummy data includes first dummy data and second dummy data, and wherein the controller is configured to determine the first dummy data and the second dummy data to reduce a cross-coupling effect between a particular storage element and storage elements adjacent to the particular storage element by preventing the particular storage element from being programmed to a highest voltage state.

12. The device of claim 11, wherein the controller is configured to select the dummy data to reduce the cross-coupling effect between storage elements of a first word line and storage elements of a second word line that is adjacent to the first word line, wherein storing the dummy data reduces the cross-coupling effect by preventing the storage elements of the first word line from being programmed to the highest voltage state.

13. The device of claim 12, wherein the controller is configured to:
track one or more parameters associated with the first word line; and
select a bit per storage element storage scheme for the first word line based on the one or more parameters.

14. The device of claim 11, wherein each word line of the multiple word lines includes an upper logical page, a middle logical page, and a lower logical page, wherein at least a portion of the dummy data is stored at the middle logical page of a word line of the multiple word lines, and wherein storing the dummy data prevents storage elements of the word line from being programmed to the highest voltage state and from being programmed to a second highest voltage state by prohibiting a first data value corresponding to the highest voltage state from being stored at the storage elements of the word line and by prohibiting a second data value corresponding to the second highest voltage state from being stored at the storage elements of the word line.

15. The device of claim 11, wherein the non-volatile memory includes a flash memory.

16. A method comprising:
in a data storage device including a controller and a non-volatile memory that includes a three-dimensional (3D) memory and circuitry associated with operation of memory cells of the 3D memory, performing:
receiving, at the controller, first data to be stored at the non-volatile memory; and
sending, from the controller, the first data, first dummy data, and second dummy data to the non-volatile memory to be stored at logical pages of a single physical page in the non-volatile memory,
wherein the single physical page includes multiple storage elements that are programmable into multiple voltage states according to a mapping of bits to states,
wherein the first dummy data and the second dummy data are selected to prevent a particular storage element of the single physical page from being programmed to a highest voltage state of the multiple voltage states and include bit values that prevent the particular storage element of the single physical page from being programmed to the highest voltage state by prohibiting a particular data value corresponding to the highest voltage state from being stored at the particular storage element to reduce a cross-coupling effect between the particular storage element and storage elements adjacent to the particular storage element and to reduce a capacitance associated with the particular storage element, wherein the non-volatile memory includes a block having multiple word lines, and wherein the controller is configured to send dummy data to alternating word lines of the multiple word lines within the block, wherein the dummy data includes the first dummy data and the second dummy data.

17. The method of claim 16, further comprising selecting whether to assign to the single physical page a single logical page of user data, two logical pages of user data, or three logical pages of user data.

18. The method of claim 16, wherein the single physical page includes three or more logical pages.

19. The method of claim 16, wherein the single physical page includes an upper logical page, a middle logical page, and a lower logical page, and wherein the first dummy data is stored at the middle logical page, and wherein the second dummy data is stored at the upper logical page or the lower logical page.

20. The method of claim 16, further comprising determining a number of logical pages of the single physical page to receive the dummy data.

* * * * *